United States Patent [19]

de Mesmaeker et al.

[11] 4,317,151

[45] Feb. 23, 1982

[54] APPARATUS FOR FAULT DIRECTION-COMPARISON PROTECTION

[75] Inventors: Ivan de Mesmaeker, Fislisbach; Peter Müller, Nussbaumen bei Baden, both of Switzerland

[73] Assignee: BBC Brown, Boveri & Company Limited, Baden, Switzerland

[21] Appl. No.: 104,170

[22] Filed: Dec. 17, 1979

[30] Foreign Application Priority Data

Jan. 3, 1979 [CH] Switzerland .............................. 12/79

[51] Int. Cl.³ .............................................. H02H 3/18
[52] U.S. Cl. ....................................... 361/69; 361/81; 361/82
[58] Field of Search ....................... 361/82, 81, 67, 68, 361/69

[56] References Cited

U.S. PATENT DOCUMENTS

| | | | |
|---|---|---|---|
| 2,777,093 | 1/1957 | Patrickson | 361/69 |
| 2,849,660 | 8/1958 | Gygax | 361/81 X |
| 3,337,774 | 8/1967 | Rockefeller, Jr. | 361/81 |
| 3,626,297 | 12/1971 | Green et al. | 361/81 X |

*Primary Examiner*—Reinhard J. Eisenzopf

*Attorney, Agent, or Firm*—Werner W. Kleeman

[57] ABSTRACT

With heretofore known directional comparison protection systems working with fault direction detectors at both ends of a line section which is to be protected and data transmission between both end stations as well as transmitters and receivers and comparison-evaluation devices for narrowing or sectionalizing the location of the fault site with respect to the line section to be protected, the reliability of such sectionalizing procedure, especially in the case of faults near to an end station, when working with series capacitors or capacitance, is dependent upon the response of the protective gap of such capacitors. With non-response there are produced transient oscillations which can falsify the directional determination. The invention solves this problem by using distance protective relays as the fault direction detectors with line replica or image impedance, which can be switched in the sense of a zone staggering protection. The image impedance for the directional comparison protection is set greater than the impedance of the line section to be protected, preferably is approximately equal to the forward network impedance of the relevant station.

5 Claims, 2 Drawing Figures

APPARATUS FOR FAULT DIRECTION-COMPARISON PROTECTION

BACKGROUND OF THE INVENTION

The present invention relates to a new and improved apparatus for fault direction-comparison protection of electrical lines, in particular containing at least one series capacitor or capacitance. At both ends of a line section to be protected there is provided a respective measuring monitoring station having a fault direction detector and between both of these stations there is arranged a transmission channel for fault direction data. Additionally, there is provided at least one comparison-evaluation device for the fault site determination with respect to the line section to be protected.

Such type equipment is known, for instance, from the publication of L. Müller, entitled "Selektivschutz electrischer Anlagen", Verlags- und Wirtschaftsgesellschaft der Electrizitätswerke m.b.H., Frankfurt/Main, 1971, page 89, and delivers a trip signal in those instances where the fault direction signals at both end stations of the line section to be monitored are directed towards the same.

For the present fields of use which are contemplated i.e. for sectionalizing or narrowing the fault site with respect to a line section, conventional directional relays of simple construction are afflicted with the drawback that there is a relatively great probability of faulty tripping in the case of near faults or short-circuits at the rear side of a measuring and monitoring station, in other words externally of the line section to be protected. This is especially so for lines or network sections having a series capacitor or a number of such capacitors or capacitances due to the pronounced transient oscillations which are formed upon failure or non-response of the standard shunt switches or protective gap at the series capacitors. Such non-response of the protective gap often cannot be avoided when encountering relatively low fault currents.

SUMMARY OF THE INVENTION

Therefore, with the foregoing in mind it is a primary object of the present invention to provide a new and improved construction of comparison protection apparatus affording improved security against faulty tripping, especially for lines or networks containing one or more series capacitors.

Now in order to implement these and still further objects of the invention, which will become more readily apparent as the description proceeds, the inventive apparatus for the fault direction-comparison protection of electrical lines is manifested by the features that as the fault direction detector of at least one station there is provided a distance protection relay containing line-image or replica impedance which can be switched, in accordance with different protective zones in a timewise staggered relationship, between different impedance values. Further, the fault direction detection has correlated thereto an impedance value of the line-image impedance which is at least approximately equal to or the same as the line section to be protected.

Under the designation "line section", as employed in this disclosure, there also is intended, whenever appropriate, to encompass a complicated network section having branched and feed-in locations and the like.

The solution of the problem is predicated upon the recognition that the content of transients and harmonics which are incorporated, by virtue of the line or fault current, into the signals used for fault distance and fault direction detection, as far as rear site faults are concerned, i.e. faults which are located opposite to the forward or trip direction with respect to the relay, is dependent upon the difference between the image impedance and the network impedance in the forward direction, inclusive of possible source impedances which may be present thereat, and therefore, can be reduced by appropriately dimensioning the image or replica impedance. With the indicated dimensioning of the image impedance for the zone setting of the distance protection relay, generally the first zone setting correlated to the direction detection, there is basically afforded, or in any event attainable, an extensive approximation of both impedance value to one another, and therefore, there is realized a corresponding reduction in transients and harmonics. In other words there also can be realized increased security for reverse-fault direction detection in the case of near or close-up faults. Particularly advantageous is dimensioning or setting of the image impedance value provided for the fault direction detection so as to be at least approximately equal to the aforementioned forward network impedance.

A further development of the invention resides in providing, apart from the first zone setting for the fault-direction detection, at least one further zone setting of the distance protection relay, which is used independently of the fault direction comparison of both stations, in other words for a distance selective protection of in each case only one station. This transition from direction comparison protection to direct distance protection is possible without any great difficulty, because the transients generally have extensively decayed within the first detection interval (stagger time). The relay thus can operate exclusively in the manner of a conventional distance stagger protection, and therefore, also can assume a multiple reserve protection function.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
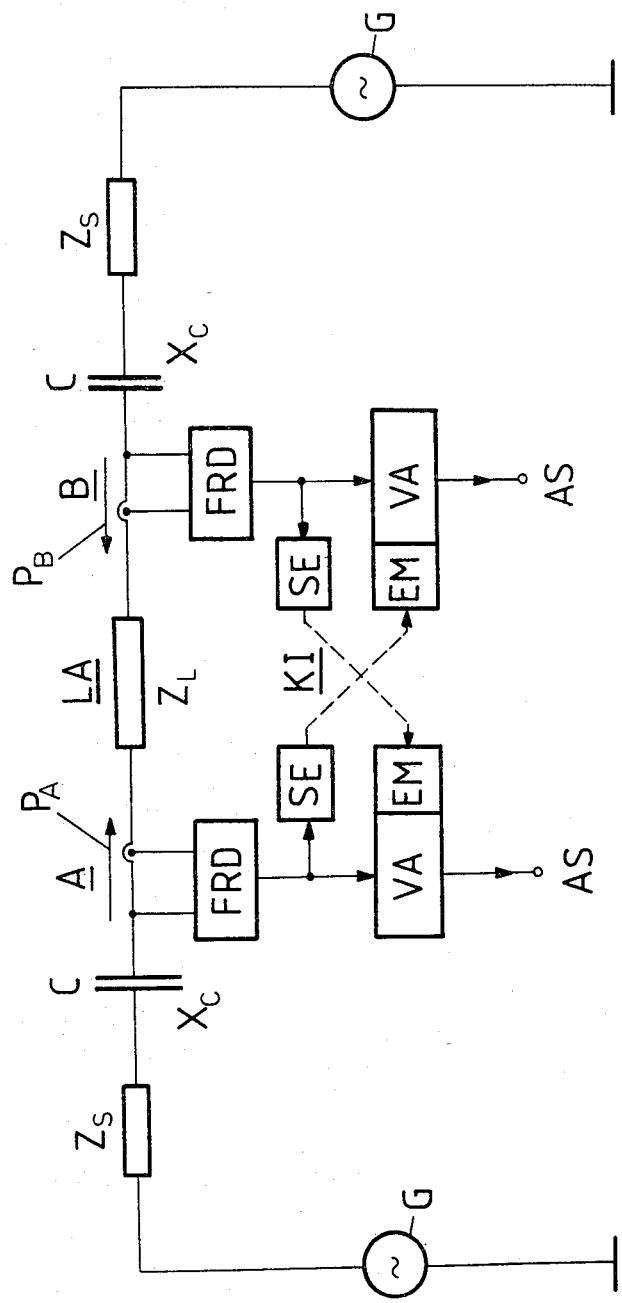
FIG. 1 is a block circuit diagram of a direction comparison protection apparatus at a line section with supply or feed sources at both ends.

Describing now the drawings, with the arrangement shown in FIG. 1 there are provided at both ends of a line section LA which is to be protected and having the line impedance $Z_L$ a respective measuring and monitoring station A and B containing the schematically indicated standard voltage and current measuring channels as well as a respective fault direction detector FRD connected therewith. The arrows $P_A$ and $P_B$ indicate in each case the forward or trip direction of the fault direction detector which points in each instance towards the line section LA. At each station A and B there is arranged thereafter a comparison-evaluation device VA, which additionally receives from the other station, by means of a dual direction-information or data channel KI containing at both ends transmitters SE and receivers EM, in each case also the fault direction information in the form of a trip signal when there has been detected a fault in the direction $P_A$ or $P_B$, respectively. A trip signal output AS is available at each station A and B for controlling a conventional and therefore not particularly further shown power switch or other protective function.

At the rear or reverse side of each station A and B, i.e. in each case opposite to the directions $P_A$ and $P_B$, there is arranged a series capacitor or capacitance C as well as a supply source G having the source impedance $Z_S$, shown by way of example. Hence, for each station A and B there is determined the forward network impedance measured in the direction $P_A$ and $P_B$, respectively, by virtue of the vector sum of the impedances $Z_L$ and $Z_S$ and the capacitive reactance $X_C$, provided that the latter is not assumed to be shunted.

Figure 2:
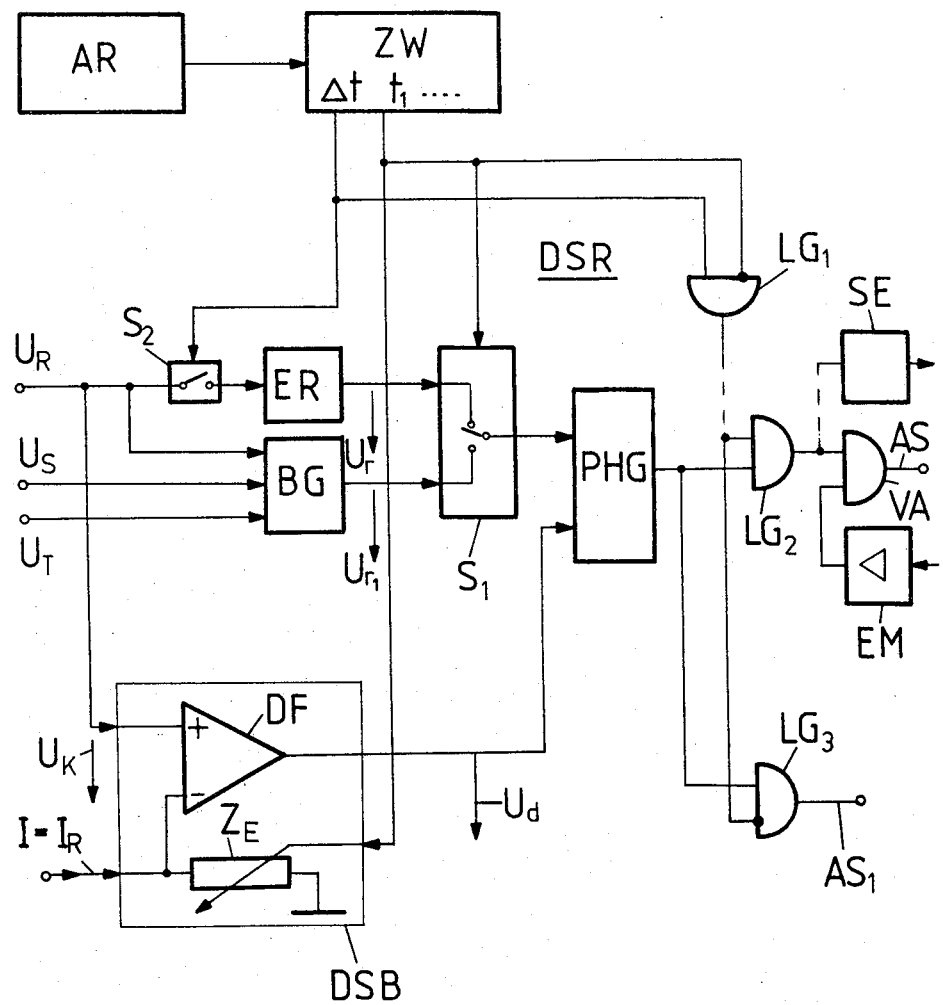
FIG. 2 is a principle circuit diagram of a distance protection relay used for fault direction detection and employing transmitters and receivers as well as comparison-evaluation logic circuitry for comparison protection.

Turning attention now to FIG. 2, there is shown details of the construction of the fault direction detector FRD having a distance protective relay DSR, an excitation device AR, and a time switching mechanism or timer ZW for the zone switching.

As the line voltage $U_K$ there is monitored, for instance, the phase voltage $U_R$, as the line current I there is monitored the phase current $I_R$. A difference voltage former DSB containing a differential amplifier DF and variable or switchable line-image or replica impedance $Z_E$ forms therefrom, in conventional manner, the difference voltage signal $U_d$ according to the equation $U_d = U_K - Z_E \cdot I$, which together with the reference voltage signal $U_r$ is delivered to a phase angle-threshold switch PHG, for instance having a phase angle-threshold value of 90°. As the reference voltage signal there is used a phase voltage $U_R$ which is rendered independent of the fault occurrence with the aid of the timing switching mechanism ZW for a starting interval $\Delta t$ in accordance with the fault direction detection. The phase voltage $U_R$ can be rendered independent of the fault occurrence by means of a known remember circuit ER, for instance a resonant circuit. Switching-on of the remember circuit ER is accomplished by means of a switch $S_2$ controlled by the timing circuit or timer ZW. Up to the first zone-switching time $t_1$ the value of the image impedance $Z_E$ is set to an impedance value which is greater in relation to the line impedance $Z_L$, so that in any event all faults arising within the line section LA lead to response of the phase angle-threshold value switch PHG, and therefore, delivers a relevant, and additionally as previously mentioned, reliable directional determination or decision. The corresponding fault direction information or data is transmitted from the not particularly referenced output of the phase angle-threshold value switch PHG, by means of the transmitter SE, to the other station and is converted by means of a comparison-evaluation device VA, here shown as a conventional AND-gate, into a valid trip signal as a function of the corresponding fault direction information of the other station received by means of the receiver EM. Yet the fault direction-comparison function is limited by means of a first logic circuit $LG_1$ controlled by the timing switching mechanism or timer ZW to the time duration of the effective remember-reference voltage. To this end there is incorporated between the phase angle-threshold value switch PHG and the comparison-evaluation device VA a second logic circuit $LG_2$ in the form of a blocking gate which is controlled by the first logic circuit $LG_1$. As an alternate hereto a second trip output $AS_1$, not shown in FIG. 1 to simplify the illustration but appearing in FIG. 2, which normally has associated therewith a standard distance protection function, during the fault direction-comparison function is blocked by means of a third blocking gate-logic circuit $LG_3$ or subsequently freed for a fault distance detection independent of the opposite station. Moreover, by means of the timing circuit ZW there is now switched through, by means of the switching element $S_1$, a reference voltage $U_{rl}$ together with the difference voltage $U_d$ to the phase angle-threshold value switch PHG. The reference voltage $U_{rl}$ is rendered independent and is suitable for the direct distance detection, i.e. no longer by remembering the fault occurrence. Additionally, the image or replica impedance $Z_E$ is switched by the timing mechanism ZW to standard fault distance-protection zones, for instance to such within or also in suitable manner externally of the line section LA. The reference voltage $U_{rl}$ for the direct distance protection function is obtained, for instance, in known manner in a reference voltage former BG in the form of a component mixture of the phase voltages $U_R$, $U_S$ and $U_T$.

While there are shown and described present preferred embodiments of the invention, it is to be distinctly understood that the invention is not limited thereto, but may be otherwise variously embodied and practiced within the scope of the following claims. Accordingly,

What we claim is:

1. An apparatus for the fault direction comparison protection of electrical lines containing at least one series capacitor, comprising:
    a respective measuring and monitoring station provided at each end of a line section to be monitored and protected;
    each measuring and monitoring station containing a fault direction detector;
    each said fault direction detector containing a timer mechanism for zone switching;
    a transmission channel means for fault direction data arranged between and operatively linking both stations;
    at least one comparison-evaluation device provided for each station for the fault direction determination with respect to the line section to be protected and cooperating with said transmission channel means;
    said fault direction detector of at least one station comprising a distance protection relay having line-image impedance which can be switched for correspondingly different protective zones with a timewise stagger between different impedance values; and
    said fault direction detection, during a starting time interval up to a first zone switching time point, having correlated thereto by means of said timing mechanism an impedance value of the line image impedance which, with respect to the line section to be protected, is at least approximately equal to or greater than such line section.

2. The apparatus as defined in claim 1, wherein:
    the impedance value of the line image impedance provided for fault direction detection is dimensioned at least approximately equal to the network impedance in the forward or trip direction of the distance protection relay.

3. The apparatus as defined in claim 1, wherein:

said distance protection relay comprises means for comparing the phase angle of the difference between a signal voltage produced at the line image impedance and a line voltage signal at a measuring location with respect to a reference voltage signal with a threshold value;

wherein when said compared phase angle exceeds or falls below the threshold value there is produced a trip or blocking signal; and the reference signal for the fault direction detection comprises an alternating-current voltage signal derived from a multi-phase line system and which at least approximately is independent from the time of fault occurrence for at least a predetermined time from a line voltage or a combination of different line voltage phases.

4. The apparatus as defined in claim 1, wherein:

said distance protection relay of the fault direction detector contains means providing a first protection zone setting correlated to the fault direction detection and at least one further protection zone setting located within the line section to be protected for effectively monitoring a fault independent of fault direction comparison protection at each of the stations.

5. The apparatus as defined in claim 1, wherein:

said fault direction detector comprises a remember circuit delivering a reference voltage signal for the fault direction detection; and said reference voltage signal delivered by said remember circuit being derived from a line voltage or a combination of different line voltage phases of a multi-phase line system and being at least approximately independent of a change in such line voltage or a combination of different line voltage phases for a limited amount of time.

* * * * *